(12) United States Patent
Matsuura

(10) Patent No.: US 6,903,027 B2
(45) Date of Patent: Jun. 7, 2005

(54) METHOD OF FORMING DIELECTRIC FILM AND DIELECTRIC FILM

(75) Inventor: Masazumi Matsuura, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/196,181

(22) Filed: Jul. 17, 2002

(65) Prior Publication Data

US 2002/0182891 A1 Dec. 5, 2002

Related U.S. Application Data

(62) Division of application No. 09/963,648, filed on Sep. 27, 2001, now abandoned.

(30) Foreign Application Priority Data

Jan. 5, 2001 (JP) ......................................... 2001-000627

(51) Int. Cl.[7] .......................... H01L 21/302; H01L 21/31
(52) U.S. Cl. ......................... 438/725; 438/707; 438/710; 438/780
(58) Field of Search ............................... 438/725, 637, 438/710, 738, 778, 780

(56) References Cited

U.S. PATENT DOCUMENTS

| | | |
|---|---|---|
| 5,177,588 A | 1/1993 | Ii et al. |
| 5,811,849 A | 9/1998 | Matsuura |
| 5,937,322 A | 8/1999 | Matsuura |
| 6,117,782 A * | 9/2000 | Lukanc et al. ............... 438/692 |
| 6,124,213 A * | 9/2000 | Usami et al. ................ 438/710 |
| 6,207,583 B1 * | 3/2001 | Dunne et al. ................ 438/725 |
| 6,232,237 B1 * | 5/2001 | Tamaoka et al. ............ 438/725 |
| 6,255,732 B1 | 7/2001 | Yokoyama et al. |
| 6,457,477 B1 * | 10/2002 | Young et al. ................ 134/1.2 |

FOREIGN PATENT DOCUMENTS

| | | |
|---|---|---|
| JP | 8-316228 | 11/1996 |
| JP | 11-176814 | 7/1999 |
| JP | 2000-77410 | 3/2000 |

* cited by examiner

Primary Examiner—Craig A. Thompson
Assistant Examiner—David L. Hogans
(74) Attorney, Agent, or Firm—Oblon, Spivak, McClelland, Maier & Neustadt, P.C.

(57) ABSTRACT

A first interlayer insulating film (3) having low dielectric constant is formed on an underlying insulating film (2) and a second interlayer insulating film (4) is formed on the first interlayer insulating film (3). Subsequently, a photoresist (5) having a pattern with openings above regions in which copper wirings are to be formed is formed on the second interlayer insulating film (4). Using the photoresist (5) as an etching mask, the second interlayer insulating film (4) and the first interlayer insulating film (3) are etched, to form a recess (6). Next, an ashing process using oxygen gas plasma (7) is performed, to remove the photoresist (5). This ashing process is performed under a plasma forming condition that the RF power is 300 W, the chamber pressure is 30 Pa, the oxygen flow is 100 sccm and the substrate temperature is 25° C. That provides a method of forming a dielectric film and a structure thereof, which allows suppression of a rise in dielectric constant of an interlayer insulating film, which is caused by a change of $Si-C_nH_{2n+1}$ bond into $Si-OH$ bond in the film.

16 Claims, 13 Drawing Sheets

F I G. 1
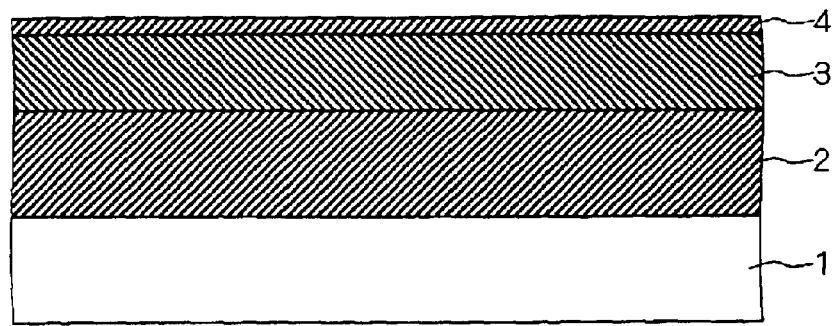
F I G. 2
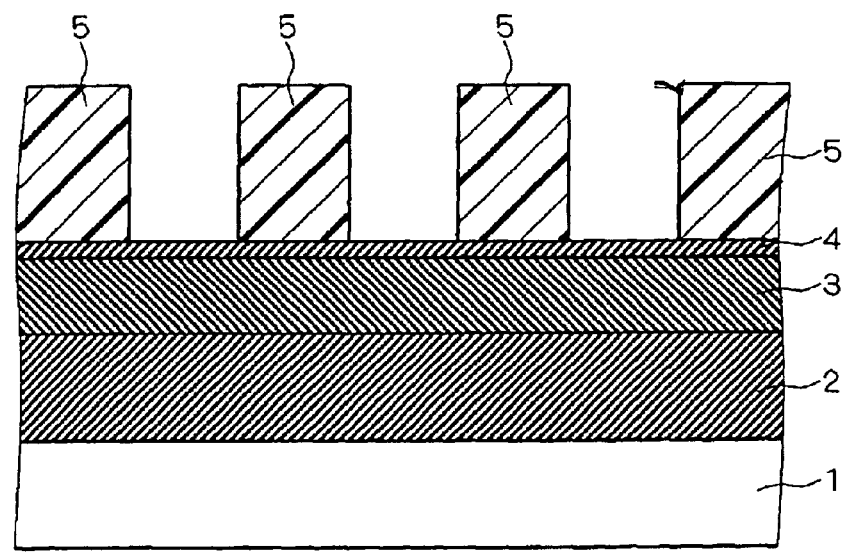

- AMOUNT OF Si-H
  - ○ SUBSTRATE TEMPERATURE 0 °C
  - △ SUBSTRATE TEMPERATURE 2 5 °C
  - □ SUBSTRATE TEMPERATURE 1 0 0 °C
- AMOUNT OF Si-OH
  - ▲ SUBSTRATE TEMPERATURE 2 5 °C
  - ■ SUBSTRATE TEMPERATURE 1 0 0 °C

F / G. 9

F I G. 10
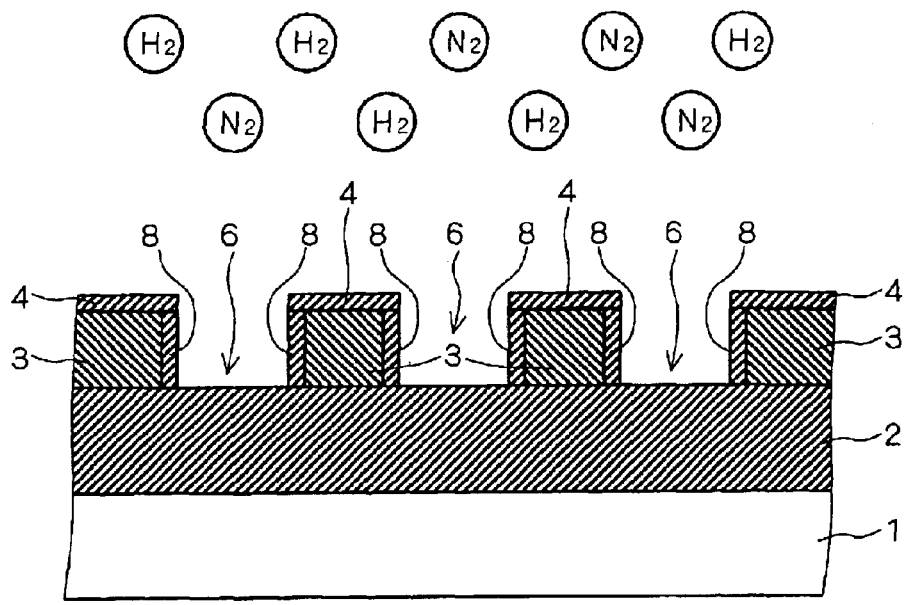
F I G. 11
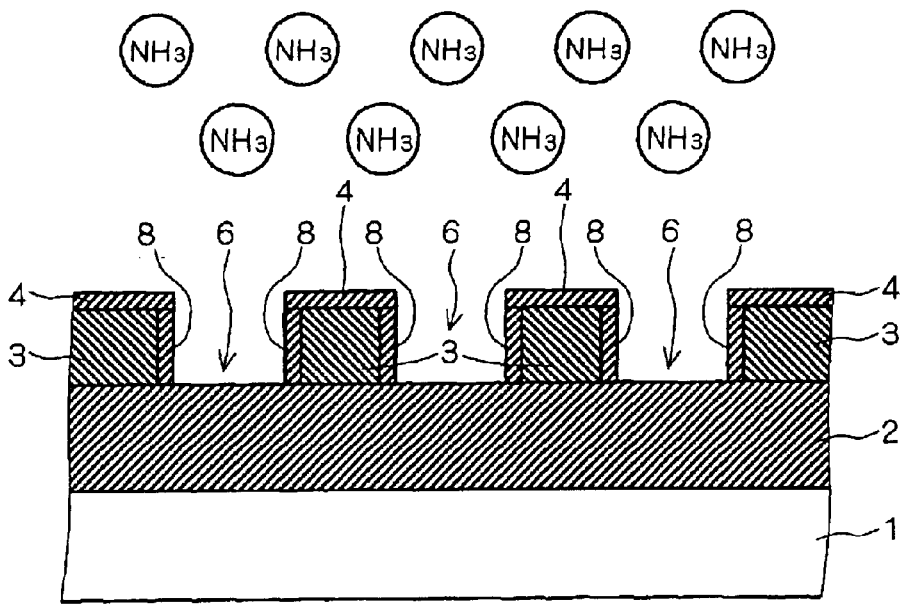

METHOD OF FORMING DIELECTRIC FILM AND DIELECTRIC FILM

This application is a divisional of U.S. application Ser. No. 09/963,648, filed Sep. 27, 2001 now abandoned. Claims 8–10 have been canceled in favor of Claims 1–7. Favorable consideration is kindly solicited.

BACKGROUND OF THE INVENTION

1. Field of the Invention

The present invention relates to a method of forming a dielectric film and a structure thereof, and more particularly to a method of forming an interlayer dielectric film in a buried wiring structure and a structure thereof.

2. Description of the Background Art

Especially in a system LSI after the 0.18-micron generation, in order to achieve speed-up of devices, it is important to reduce signal delay of the devices. The signal delay of a device is a sum of signal delay in transistors and that in interconnection. As reduction in wiring pitch rapidly proceeds, the effect of the signal delay in interconnection becomes larger than that in transistors. Since the signal delay in interconnection is in proportion to the RC product (wiring resistance x wiring capacitance), in order to reduce the signal delay in interconnection, it is necessary to reduce the wiring resistance or the wiring capacitance. Therefore, an insulating film having lower relative dielectric constant than that of a silicon oxide film which is a general insulating film is used as an interlayer insulating film and a copper wiring having lower wiring resistance than that of an aluminum wiring which is a general metal wiring is used as a buried wiring, to reduce the signal delay in interconnection.

FIGS. 13 to 17 are cross sections showing a method of forming a buried copper wiring in the background art step by step. First, referring to FIG. 13, an underlying insulating film 102 made of silicon oxide film is formed on a silicon substrate 101. Though not shown in FIG. 13, semiconductor elements such as transistors are formed in the silicon substrate 101 and the underlying insulating film 102. For example, source/drain regions are selectively formed in an upper surface of the silicon substrate 101 and a gate electrode is selectively formed on the upper surface of the silicon substrate 101. Further, source/drain wirings connected to the source/drain regions are selectively formed in the underlying insulating film 102.

Subsequently, a first interlayer insulating film 103 is formed on the underlying insulating film 102. The first interlayer insulating film 103 is an insulating film made of a material having lower relative dielectric constant than that of the silicon oxide film. For example, a film such as Hydrogen Silsesquioxane, Methyl Silsesquioxane (MSQ), Poly arylether, Benzocyclobutene, Polytetrafluoroethylene, Xerogel or Aerogel is formed by the spin-on method. Alternatively, a film such as SiOF film, CF film, Parylene or SiOC film is formed by the CVD (Chemical Vapor Deposition) method. The relative dielectric constants of these materials range from about 1.8 to 3.7.

Subsequently, a second interlayer insulating film 104 is formed on the first interlayer insulating film 103. As the material of the second interlayer insulating film 104, a silicon nitride film (whose relative dielectric constant is 7.4), a silicon oxide film (whose relative dielectric constant ranges from 4.3 to 4.5), a silicon carbide film (whose relative dielectric constant ranges from 4,3 to 4.7) or the like is used.

Next, referring to FIG. 14, a photoresist 105 having a pattern with openings above regions in which the copper wirings are to be formed is formed on the second interlayer insulating film 104 by photolithography.

Next, referring to FIG. 15, using the photoresist 105 as an etching mask, the second interlayer insulating film 104 and the first interlayer insulating film 103 are etched in this order by anisotropic dry etching with high etching rate in a direction of depth of the silicon substrate 101, to expose an upper surface of the underlying insulating film 102. Through this step formed is a recess 106 having a bottom surface defined by the upper surface of the underlying insulating film 102 and a side surface defined by a sidewall of the first interlayer insulating film 103 and a sidewall of the second interlayer insulating film 104.

Next, referring to FIG. 16, the photoresist 105 is removed by ashing process using oxygen gas plasma 107. The ashing process is performed under a plasma forming condition that the RF power is 900 W, the chamber pressure is 133 Pa, the oxygen flow is 2000 sccm and the substrate temperature is 200° C.

Subsequently, a tantalum nitride (TaN) film (not shown) is entirely formed by sputtering method and then a copper film is so formed as to have such a film thickness as to fill the inside of the recess 106 by sputtering method or plating method. Next, referring to FIG. 17, the copper film and the TaN film are polished by the CMP (Chemical Mechanical Polishing) method until an upper surface of the second interlayer insulating film 104 is exposed. Through this step formed is a copper wiring 109 for filling the inside of the recess 106 with the not-shown TaN film interposed therebetween. Further, the TaN film is formed in order to prevent diffusion of copper atoms of the copper wiring 109 into the first and second interlayer insulating films 103 and 104.

Thus, in the background-art method of forming a buried copper wiring, the ashing process using the oxygen gas plasma 107 is performed under the plasma forming condition that the chamber pressure is 133 Pa and the substrate temperature is 200° C. in the step of removing the photoresist 105 (FIG. 16). For this reason, when an insulating film including Si—$C_nH_{2n+1}$ bond (n: natural number) therein, such as an MSQ film or an SiOC film including Si—$CH_3$ bond, is used as the first interlayer insulating film 103, the Si—$CH_3$ bond in the film is decomposed by the oxygen gas plasma 107 into Si—OH bond, as shown in the chemical equation (1):

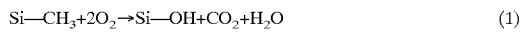

$$Si—CH_3 + 2O_2 \rightarrow Si—OH + CO_2 + H_2O \quad (1)$$

As a result, as shown in FIG. 16, a damage layer 110 including a lot of Si—OH bond is formed inside the inner wall of the first interlayer insulating film 103. FIG. 18 is a graph showing an infrared absorption spectrum of an MSQ film with respect to the sidewall portion of the first interlayer insulating film 103 in a case where the MSQ film is adopted as the first interlayer insulating film 103. It can be seen from FIG. 18 that a spectrum caused by Si—OH bond, which does not exist before performing the ashing process (before irradiation of gas plasma), is generated after performing the ashing process (after irradiation of gas plasma).

Since the Si—OH bond has an orientational polarization component, the relative dielectric constant of the first interlayer insulating film 103 in which the damage layer 110 exists is higher than that of the first interlayer insulating film 103 in which no damage layer 110 exists. Further, since the Si—OH bond becomes an adsorption site of moisture in the atmosphere, a lot of absorbed moisture exists in the damage layer 110 and therefore the relative dielectric constant of the first interlayer insulating film 103 becomes still higher.

FIG. 19 is a graph showing variation in relative dielectric constant of the first interlayer insulating film 103 between before and after performing the ashing process for removing the photoresist 105. The relative dielectric constant after performing the ashing process (after irradiation of gas plasma) is higher than that before performing the ashing process (before irradiation of gas plasma) by 48%.

Thus, the background-art method of forming a buried copper wiring has the following problem: when the insulating film including Si—$C_nH_{2n+1}$ bond is adopted as the first interlayer insulating film 103, much of the Si—$C_nH_{2n+1}$ bond in the film is changed into Si—OH bond through the ashing process for removing the photoresist 105 and that causes a rise in relative dielectric constant of the first interlayer insulating film 103, leading to an increase in wiring capacitance.

SUMMARY OF THE INVENTION

The present invention is directed to a method of forming a dielectric film. According to a first aspect of the present invention, the method of forming a dielectric film comprises the steps of: (a) forming an insulating film including Si—$C_nH_{2n+1}$ bond; (b) forming a resist selectively on a main surface of the insulating film; (c) removing the insulating film not covered with the resist to form a recess in the main surface of the insulating film; and (d) performing an ashing process using gas plasma under a condition that the Si—$C_nH_{2n+1}$ bond should not be changed to Si—OH bond to remove the resist.

According to a second aspect of the present invention, in the method of forming a dielectric film of the first aspect, the Si—$C_nH_{2n+1}$ bond is changed to Si—H bond in the ashing process under the condition in the step (d).

According to a third aspect of the present invention, in the method of forming a dielectric film of the first aspect, the condition is that oxygen gas plasma is used, the temperature is 25° C. or lower and the chamber pressure ranges from 4 to 70 Pa.

According to a fourth aspect of the present invention, in the method of forming a dielectric film of the first aspect, the condition is that oxygen gas plasma is used, the temperature is 100° C. or lower and the chamber pressure ranges from 4 to 13.3 Pa.

According to a fifth aspect of the present invention, in the method of forming a dielectric film of the first aspect, the ashing process is performed by using hydrogen gas plasma or ammonia gas plasma in the step (d).

Preferably, the method of forming a dielectric film of the first aspect further comprises the step of: (e) filling the inside of the recess with a metal film, and in the method, the step (e) is executed after the step (d).

Preferably, the insulating film is formed on an underlying layer in the step (a), and the recess is so formed as not to reach the underlying layer in the step (c).

The present invention is also directed to a dielectric film. According to a sixth aspect of the present invention, the dielectric film comprises: an insulating film including Si—$C_nH_{2n+1}$ bond; a recess formed selectively in a main surface of the insulating film; and a surface protective layer including Si—H bond, being formed in a surface of the insulating film in an inner wall of the recess.

Preferably, the dielectric film of the sixth aspect further comprises: a metal film for filling the inside of the recess.

Preferably, the dielectric film is formed on an underlying layer, and the recess is so formed, extending from the main surface of the insulating film, as not to reach the underlying layer.

In the method of forming an insulating film of the first and second aspects, since the Si—$C_nH_{2n+1}$ bond included in the surface of the insulating film in the inner wall of the recess is not changed to the Si—OH bond through the ashing process in the step (d), it is possible to suppress a rise in relative dielectric constant of the insulating film.

In the method of forming an insulating film of the third and fourth aspects, it is possible to appropriately change the Si—$C_nH_{2n+1}$ bond included in the insulating film to the Si—H bond.

In the method of forming an insulating film of the fifth aspect, it is possible to avoid the change of the Si—$C_nH_{2n+1}$ bond included in the insulating film into the Si—OH bond and suppress a rise in relative dielectric constant of the insulating film, which is caused by the Si—OH bond.

In the insulating film of the sixth aspect, the Si—H bond exists in the surface protective layer. Therefore, the insulating film of the sixth aspect can suppress or avoid a rise in relative dielectric constant of the insulating film, as compared with an insulating film in which a layer including the Si—OH bond, instead of the surface protective layer including the Si—H bond, is formed in its surface.

An object of the present invention is to provide a method of forming a dielectric film and a structure thereof, which can suppress a rise in relative dielectric constant of an interlayer insulating film, which is caused by a change of Si—$C_nH_{2n+1}$ bond in the film into Si—OH bond, in a buried wiring structure in which an insulating film including Si—$C_nH_{2n+1}$ bond is adopted as the interlayer insulating film.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 5 are cross sections showing a method of forming a buried copper wiring in accordance with a first preferred embodiment step by step;

FIGS. 10 and 11 are cross sections each showing a step in a method of forming a buried copper wiring in accordance with a second preferred embodiment;

DESCRIPTION OF THE PREFERRED EMBODIMENTS

The First Preferred Embodiment

Figure 3:
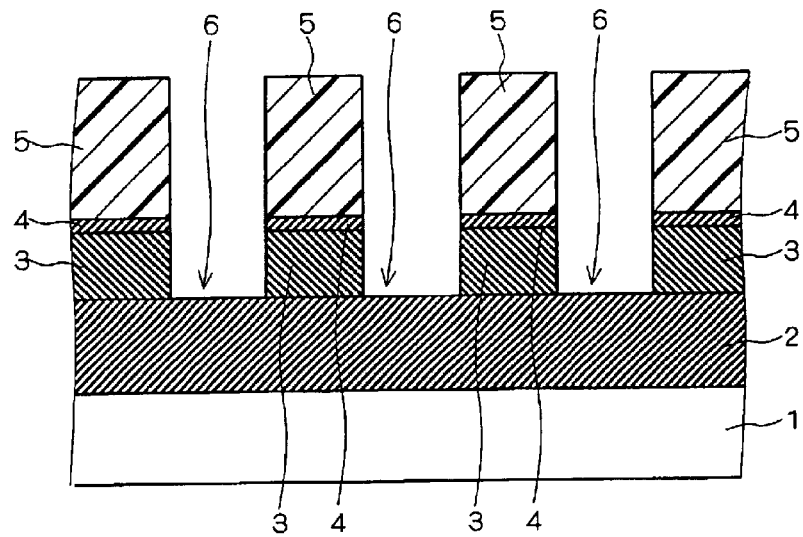

FIGS. 1 to 5 are cross sections showing a method of forming a buried copper wiring in accordance with the first preferred embodiment step by step. First, referring to FIG. 1, an underlying insulating film 2 made of silicon oxide film is formed on a silicon substrate 1. Though not shown in FIG. 1, semiconductor elements such as transistors are formed in the silicon substrate 1 and the underlying insulating film 2. For example, source/drain regions are selectively formed in an upper surface of the silicon substrate 1 and a gate electrode is selectively formed on the upper surface of the silicon substrate 1. Further, source/drain wirings connected to the source/drain regions are selectively formed in the underlying insulating film 2.

Subsequently, a first interlayer insulating film 3 functioning as a dielectric film is formed on the underlying insulating film 2. The first interlayer insulating film 3, however, may be directly formed on the silicon substrate 1 in which the semiconductor elements are formed, instead of being formed on the underlying insulating film 2. The first interlayer insulating film 3 is an insulating film made of a material having lower relative dielectric constant than that of the silicon oxide film which is a general insulating film. As the first interlayer insulating film 3, for example, a film such as Hydrogen Silsesquioxane, Methyl Silsesquioxane (MSQ), Poly arylether, Benzocyclobutene, Polytetrafluoroethylene, Xerogel or Aerogel is formed by the spin-on method. Alternatively, a film such as SiOF film, CF film, Parylene or SiOC film is formed by the CVD method. In the first preferred embodiment, as the first interlayer insulating film 3, an insulating film (MSQ film in this preferred embodiment) including Si—$C_nH_{2n+1}$ bond therein is adopted.

Subsequently, a second interlayer insulating film 4 is formed on the first interlayer insulating film 3. As the material of the second interlayer insulating film 4, a silicon nitride film, a silicon oxide film, a silicon carbide film or the like is used. The second interlayer insulating film 4, however, may not be necessarily formed.

Next, referring to FIG. 2, a photoresist 5 having a pattern with openings above regions in which the copper wirings are to be formed is formed on the second interlayer insulating film 4 by photolithography. When the second interlayer insulating film 4 is not formed, the photoresist 5 is formed on the first interlayer insulating film 3.

Next, referring to FIG. 3, using the photoresist 5 as an etching mask, the second interlayer insulating film 4 and the first interlayer insulating film 3 are etched in this order by anisotropic dry etching with high etching rate in a direction of depth of the silicon substrate 1, to expose an upper surface of the underlying insulating film 2. Through this step formed is a recess 6 having a bottom surface defined by the upper surface of the underlying insulating film 2 and an inner wall defined by a sidewall of the first interlayer insulating film 3 and a sidewall of the second interlayer insulating film 4.

Figure 4:
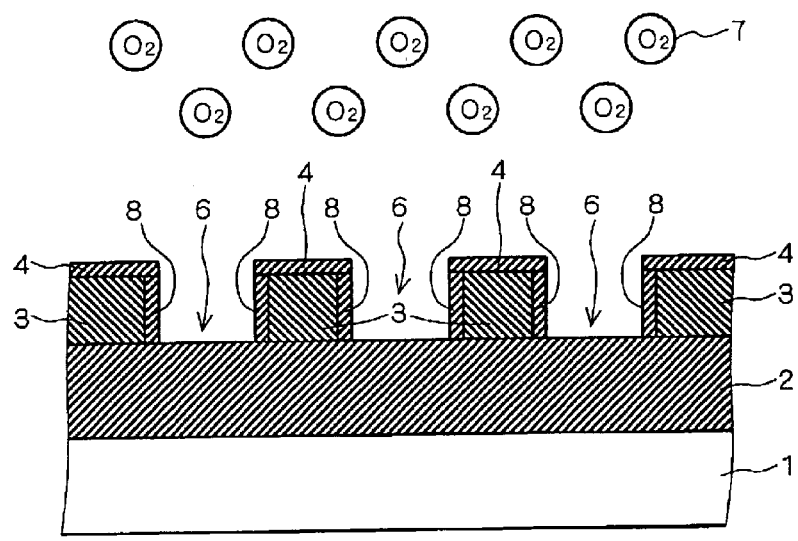
Figure 5:
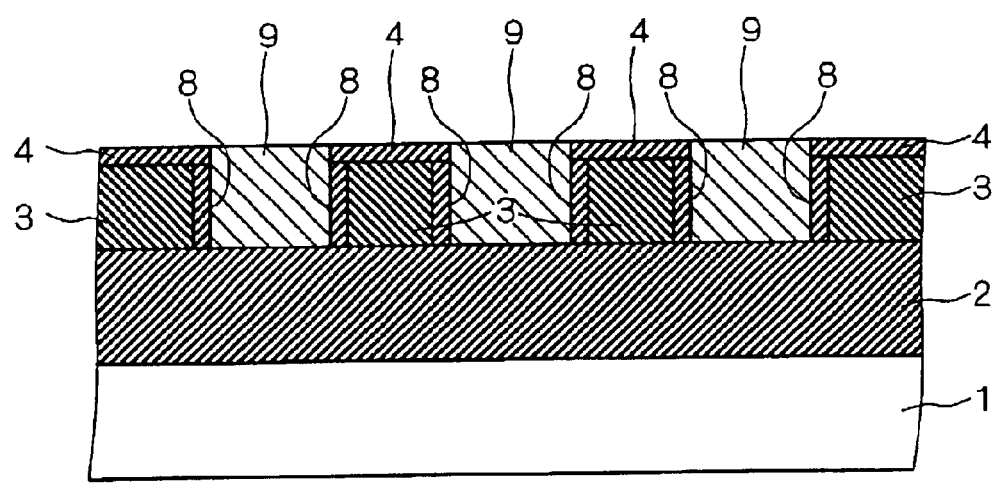
Figure 6:
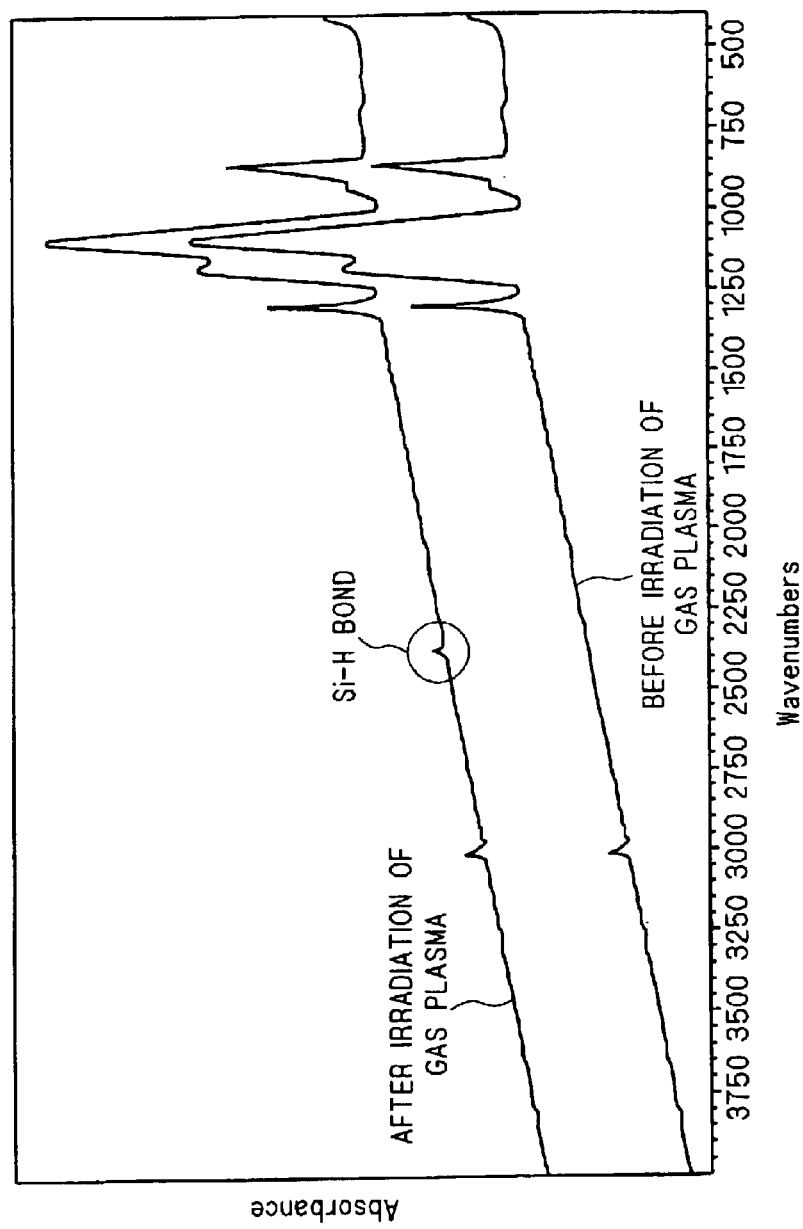
FIG. 6 is a graph showing an infrared absorption spectrum of an MSQ film with respect to a sidewall portion of a first interlayer insulating film.

Next, referring to FIG. 4, the photoresist 5 is removed by ashing process using an oxygen gas plasma 7. The ashing process is performed under a plasma forming condition that the RF power is 300 W, the chamber pressure is 30 Pa, the oxygen flow is 100 sccm and the substrate temperature is 25° C. When the ashing process is performed under such a condition as above, as shown in FIG. 4, a surface protective layer 8 is formed inside the sidewall of the first interlayer insulating film 3. FIG. 6 is a graph showing an infrared absorption spectrum of the MSQ film with respect to the sidewall portion of the first interlayer insulating film 3. It can be seen from FIG. 6 that a spectrum caused by Si—H bond, which does not exist before performing the ashing process (before irradiation of the oxygen gas plasma 7 on the first interlayer insulating film 3), is generated after performing the ashing process (after irradiation of the oxygen gas plasma 7 on the first interlayer insulating film 3). The reason is that Si—$CH_3$ bond in the MSQ film is decomposed by the oxygen gas plasma 7 into Si—H bond, as shown in the chemical equation (2):

$$\text{Si—CH}_3+\text{O}_2 \rightarrow \text{Si—H}+\text{CO}+\text{H}_2\text{O} \qquad (2)$$

Unlike Si—OH bond, Si—H bond has no orientational polarization component and does not become an adsorption site of moisture in the atmosphere. Therefore, even if the surface protective layer 8 including Si—H bond is formed inside the sidewall of the first interlayer insulating film 3, Si—H bond does not cause a rise in relative dielectric constant of the first interlayer insulating film 3.

Figure 7:
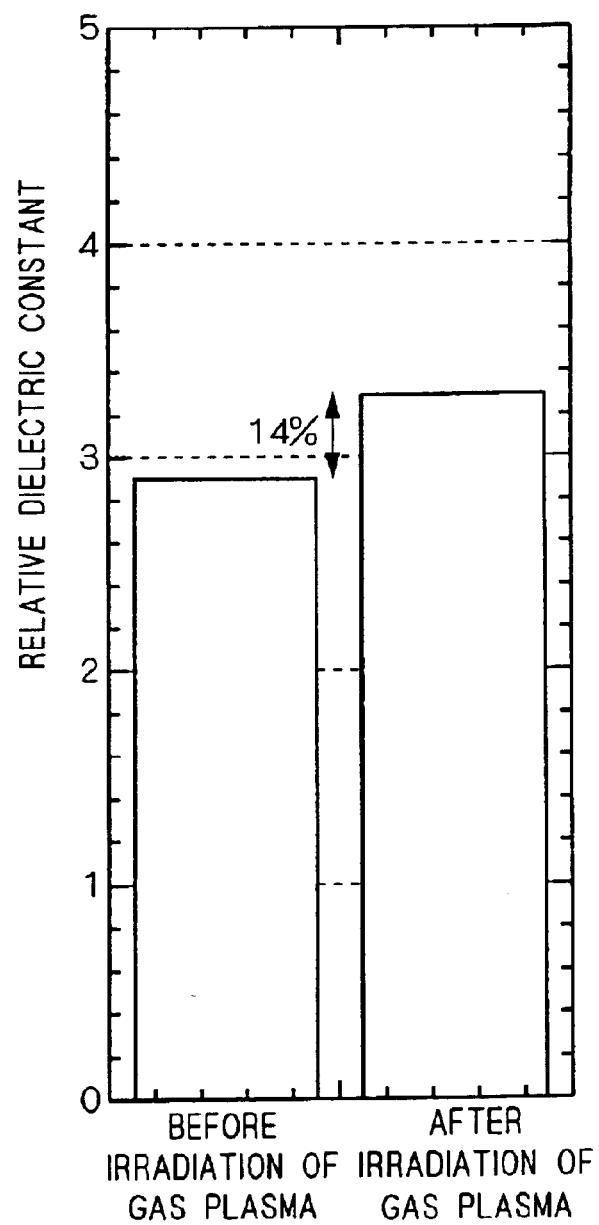
FIG. 7 is a graph showing variation in dielectric constant of the first interlayer insulating film between before and after performing an ashing process.
Figure 19:
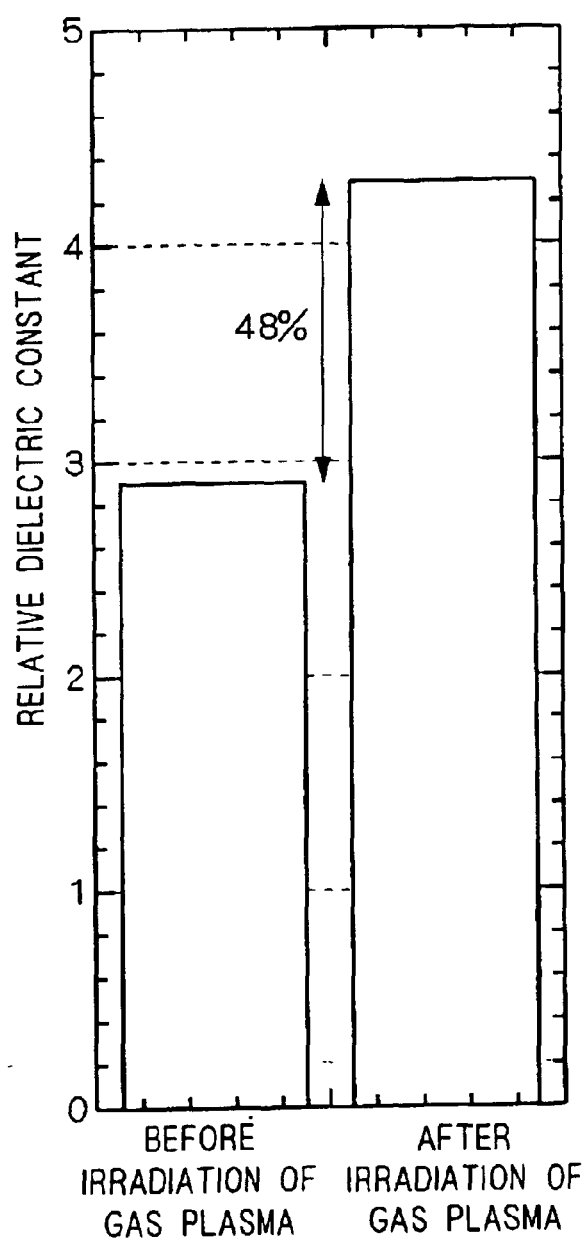
FIG. 19 is a graph showing variation in dielectric constant of the first interlayer insulating film between before and after performing an ashing process.

FIG. 7 is a graph showing variation in relative dielectric constant of the first interlayer insulating film 3 between before and after performing the ashing process for removing the photoresist 5. It can be seen from FIG. 7 that the rise in relative dielectric constant after performing the ashing process as compared with before performing the ashing process is suppressed to 14% (48% in FIG. 19 of the background art).

Subsequently, a tantalum nitride (TaN) film (not shown) is entirely formed by sputtering method and then a copper film is so formed as to have such a film thickness as to fill the inside of the recess 6 by sputtering method or plating method. Next, referring to FIG. 5, the copper film and the TaN film are polished by the CMP method until an upper surface of the second interlayer insulating film 4 is exposed. Through this step formed is a copper wiring 9 for filling the inside of the recess 6 with the not-shown TaN film interposed therebetween. Further, the TaN film is formed in order to prevent diffusion of copper atoms of the copper wiring 9 into the first and second interlayer insulating films 3 and 4.

The condition to obtain Si—H bond, instead of Si—OH bond, by the ashing process for removing the photoresist 5 is as follows.

Figure 8:
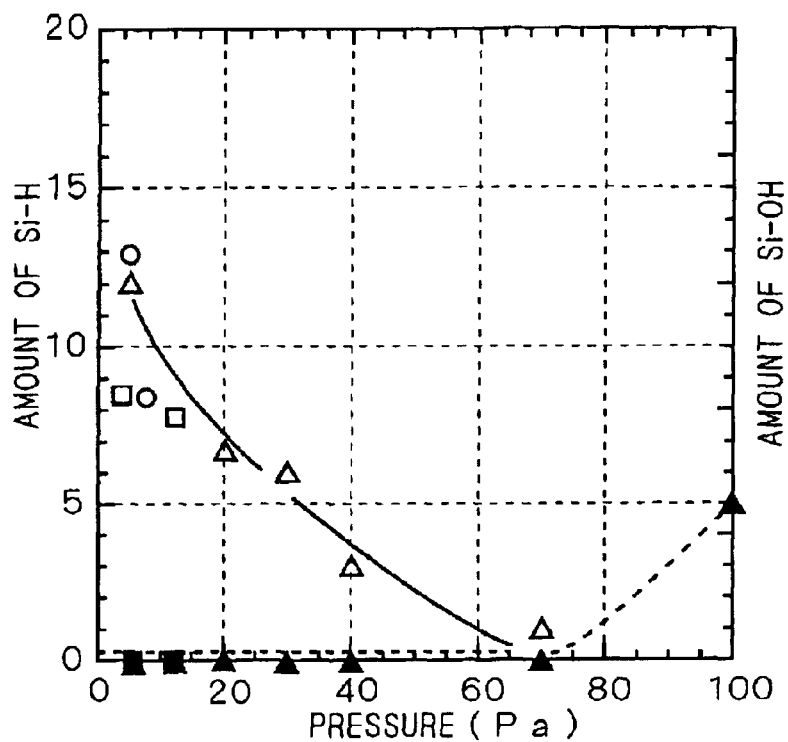
FIG. 8 is a graph showing a measurement result of the amount of Si—H bond generated in the first interlayer insulating film after irradiation of oxygen gas plasma under varying chamber pressures.

FIG. 8 is a graph showing a measurement result of the amount of Si—H bond generated in the first interlayer insulating film 3 after irradiation of the oxygen gas plasma 7 under varying chamber pressures. In FIG. 8, the amount of Si—H on the vertical axis is represented by an area value for absorption of the infrared absorption spectrum, which is caused by Si—H bond. As can be seen from FIG. 8, the amount of Si—H decreases as the chamber pressure rises and when the substrate temperature is 25° C., for example, almost no Si—H bond is generated when the chamber pressure becomes over 70 Pa. Further, the amount of Si—OH decreases as the chamber pressure falls and when the substrate temperature is 25° C., for example, almost no Si—OH bond is generated when the chamber pressure becomes 70 Pa or lower. Therefore, in order to generate Si—H bond, instead of Si—OH bond, in the fist interlayer insulating film 3 after irradiation of the oxygen gas plasma 7, when the substrate temperature is 25° C., for example, it is only necessary to set the upper limit of the chamber pressure to 70 Pa. Since it becomes difficult to provide the oxygen gas plasma 7 stably when the chamber pressure becomes below 4 Pa, however, it is necessary to set the lower limit of the chamber pressure to 4 Pa.

Further, as shown in FIG. 8, when the substrate temperature is 100° C., no Si—OH bond is detected and Si—H bond is generated in the interlayer insulating film 3 both in the cases where the chamber pressure is 4 Pa and 13.3 Pa. Therefore, when the substrate temperature is 100° C., the effect of the present invention can be produced at least in the range of the chamber pressure from 4 to 13.3 Pa.

Figure 9:
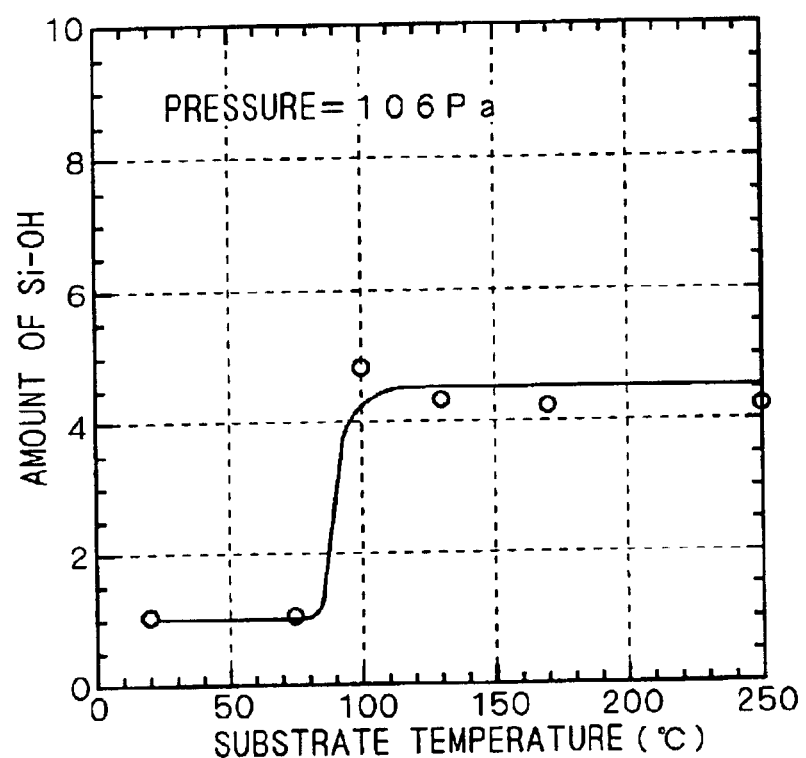
FIG. 9 is a graph showing a measurement result of the amount of Si—OH bond generated in the first interlayer insulating film after irradiation of oxygen gas plasma under varying substrate temperatures.

FIG. 9 is a graph showing a measurement result of the amount of Si—OH bond generated in the first interlayer insulating film 3 after irradiation of the oxygen gas plasma 7 under fixed chamber pressure of 106 Pa and varying substrate temperatures. In FIG. 9, the amount of Si—OH on the vertical axis is represented by an area value for absorption of the infrared absorption spectrum, which is caused by Si—OH bond. As can be seen from FIG. 9, the amount of Si—OH bond decreases as the substrate temperature falls, in other words, it becomes likely to generate the Si—H bond depending on the condition of chamber pressure.

Therefore, it can be seen from FIGS. 8 and 9 that the Si—H bond can be obtained by the ashing process for removing the photoresist 5 under the condition that the chamber pressure ranges from 4 to 70 Pa when the substrate temperature is 25° C. or lower or the chamber pressure ranges from 4 to 13.3 Pa when the substrate temperature is 100° C. or lower, and further no Si—OH bond is generated under the same condition.

In the method of forming a buried copper wiring of the first preferred embodiment, the ashing process for removing the photoresist 5 is performed by using the oxygen gas plasma under the condition that the chamber pressure ranges from 4 to 70 Pa when the substrate temperature is 25° C. or lower or the chamber pressure ranges from 4 to 13.3 Pa when the substrate temperature is 100° C. or lower. Through this ashing process formed is the surface protective layer 8 including the Si—H bond, not including the Si—OH bond, in the surface of the first interlayer insulating film 3 in the inner wall of the recess 6. As a result, it becomes possible to suppress a rise in relative dielectric constant of the first interlayer insulating film 3.

The Second Preferred Embodiment

FIGS. 10 and 11 are cross sections each showing a step in a method of forming a buried copper wiring in accordance with the second preferred embodiment. Though the oxygen gas plasma is used in the ashing process for removing the photoresist 5 (FIG. 4) in the first preferred embodiment, a mixed gas of nitrogen and hydrogen as shown in FIG. 10 or an ammonia gas as shown in FIG. 11 may be used, instead of the oxygen gas. Other steps in the method of forming a buried copper wiring of the second preferred embodiment are the same as those in the first preferred embodiment. The chemical equation in a case of using the mixed gas of nitrogen and hydrogen is as follows:

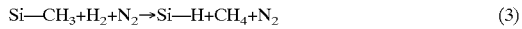

$$Si-CH_3 + H_2 + N_2 \rightarrow Si-H + CH_4 + N_2 \quad (3)$$

The chemical equation in a case of using the ammonia gas is as follows:

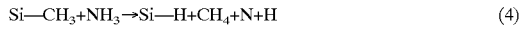

$$Si-CH_3 + NH_3 \rightarrow Si-H + CH_4 + N + H \quad (4)$$

It can be seen from the equations (3) and (4) that the Si—CH$_3$ bond is decomposed and Si—H bond is generated both in the cases. Therefore, like in the first preferred embodiment, it is possible to form the surface protective layer 8 including the Si—H bond, not including the Si—OH bond. In the case of using the mixed gas of nitrogen and hydrogen, the nitrogen gas is mixed from a safety standpoint and may not be necessarily mixed from a standpoint of generation of the Si—H bond.

Thus, in the method of forming a buried copper wiring of the second preferred embodiment, it is possible to form the surface protective layer 8 including the Si—H bond, not including the Si—OH bond, in the surface of the first interlayer insulating film 3 in the inner wall of the recess 6 by performing the ashing process using the mixed gas of nitrogen and hydrogen or the ammonia gas. Therefore, it becomes possible to avoid a rise in relative dielectric constant of the first interlayer insulating film 3.

The Third Preferred Embodiment

In the above method of forming a buried copper wiring of the first and second preferred embodiments, the recess 6 having the bottom surface defined by the upper surface of the underlying insulating film 2 is formed in the etching step of FIG. 3. At that time, there may be a case where the etching is stopped before the upper surface of the underlying insulating film 2 is exposed, to form the recess 6 having the bottom surface defined by the first interlayer insulating film 3.

Figure 12:
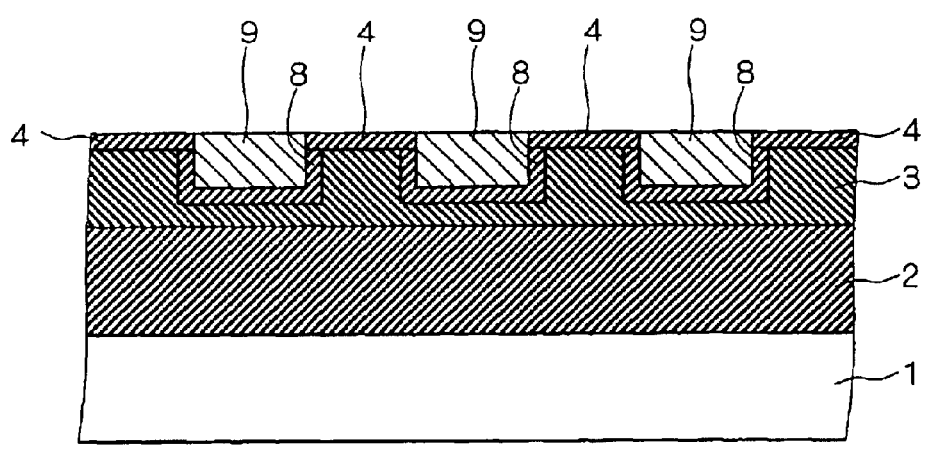
FIG. 12 is a cross section showing a structure formed by a method of forming a buried copper wiring in accordance with a third preferred embodiment.
Figure 13:
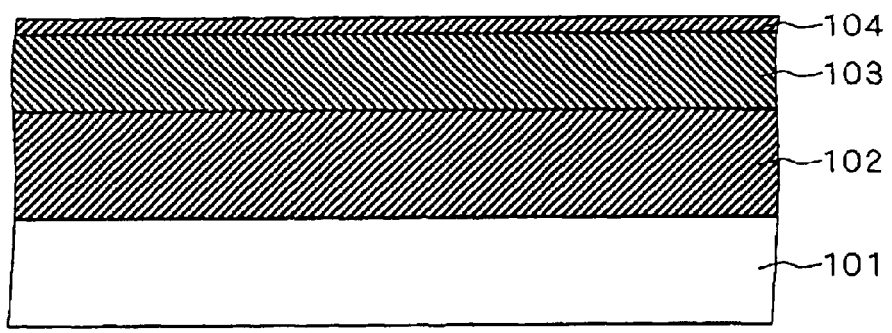
FIGS. 13 to 17 are cross sections showing a method of forming a buried copper wiring in the background art step by step.
Figure 14:
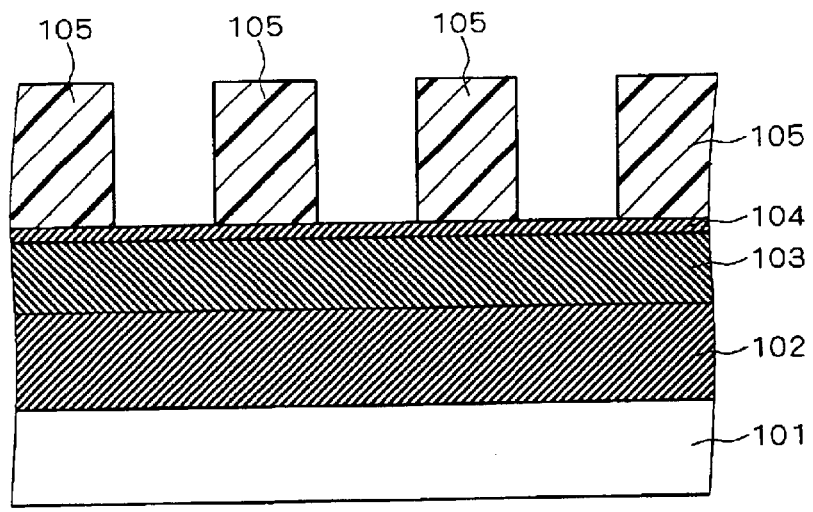
Figure 15:
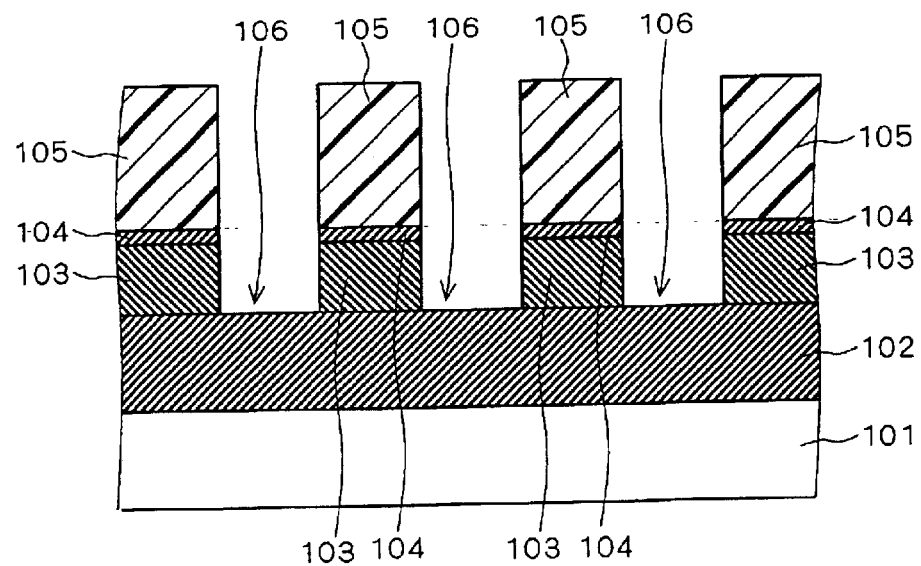
Figure 16:
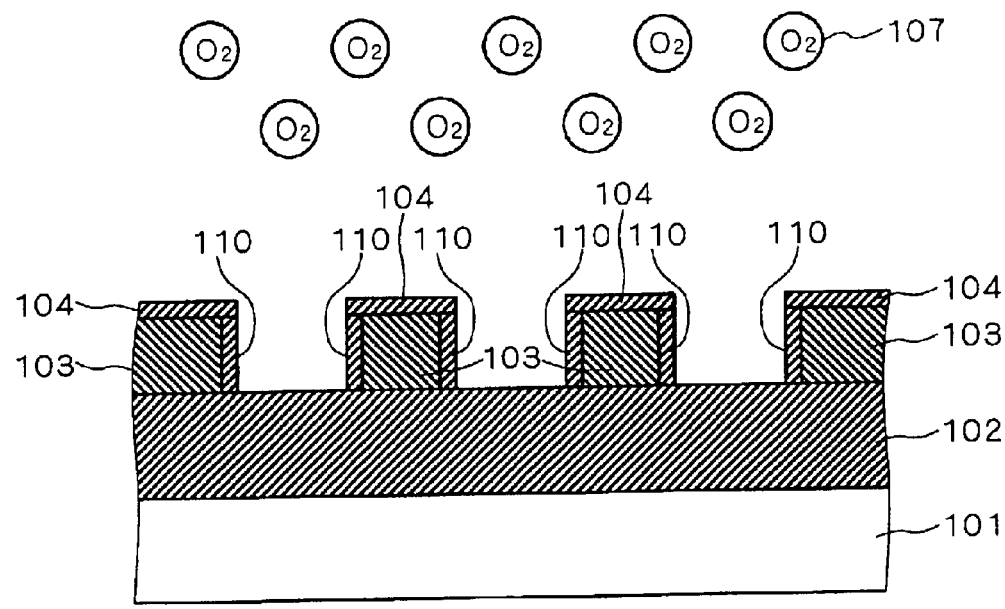
Figure 17:
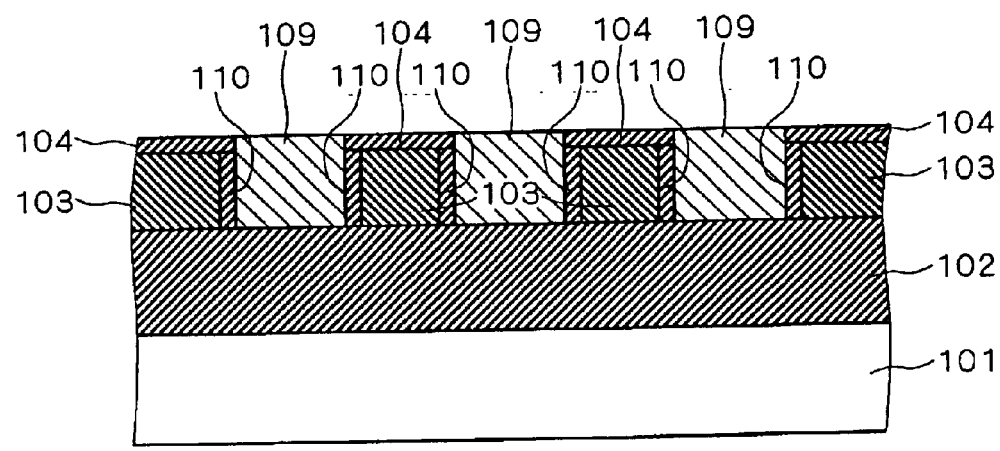
Figure 18:
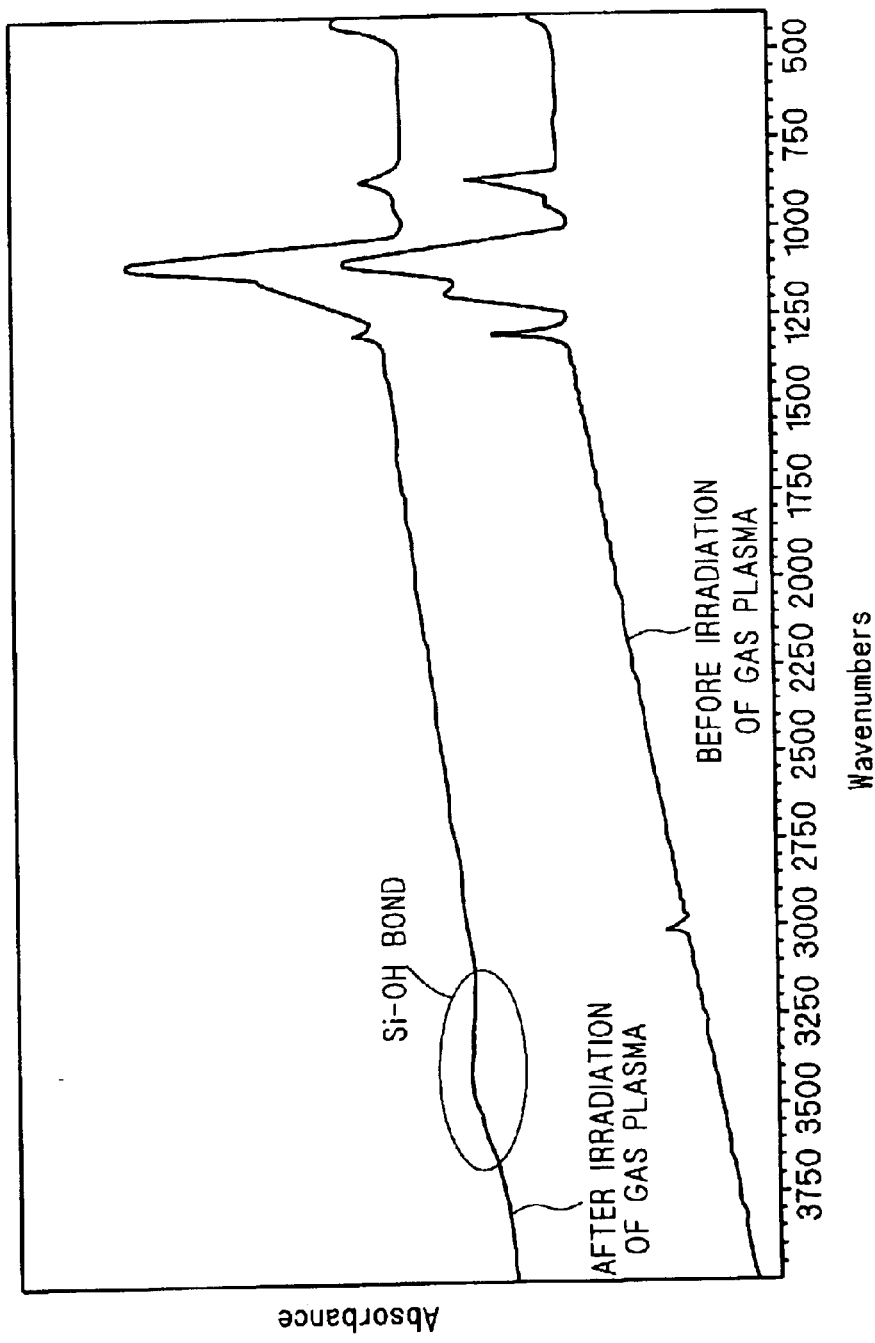
FIG. 18 is a graph showing an infrared absorption spectrum of an MSQ film with respect to a sidewall portion of the first interlayer insulating film.

Next, the photoresist 5 is removed by the ashing process using the oxygen gas plasma (in the first preferred embodiment) or the ashing process using the mixed gas of nitrogen and hydrogen or the ammonia gas (in the second preferred embodiment). The ashing process is performed under the same condition as in the first and second preferred embodiments. After that, like in the first and second preferred embodiments, the TaN film is formed and then the copper wiring 9 is formed to fill the inside of the recess 6 with the TaN film interposed therebetween. FIG. 12 is a cross section showing a structure formed by a method of forming a buried copper wiring in accordance with the third preferred embodiment.

Thus, in the method of forming a buried copper wiring of the third preferred embodiment, it is possible to form the surface protective layer 8 including the Si—H bond, not including the Si—OH bond, in the surface of the first interlayer insulating film 3 in the inner wall (i.e., the side surface and the bottom surface) of the recess 6. As a result, it becomes possible to avoid a rise in relative dielectric constant of the first interlayer insulating film 3.

While the invention has been shown and described in detail, the foregoing description is in all aspects illustrative and not restrictive. It is therefore understood that numerous modifications and variations can be devised without departing from the scope of the invention.

What is claimed is:

1. A method of forming a dielectric film, comprising the steps of:

(a) forming an insulating film including Si—C$_n$H$_{2n+1}$ bond;

(b) forming a resist selectively on a main surface of said insulating film;

(c) removing said insulating film not covered with said resist to form a recess in said main surface of said insulating film; and (d) performing an ashing process using gas plasma to remove said resist;

wherein said step (d) is carried out under a condition that said Si—C$_n$H$_{2n+1}$ bond is not change to Si—OH bond, and wherein said condition is either (1) or (2), wherein (1) oxygen gas plasma at a temperature of 25° C. or lower and a chamber pressure ranging from 4 to 70 Pa, wherein oxygen is the sole active component, and (2) oxygen gas plasma at a temperature of 100° C. or lower and a chamber pressure ranging from 4 to 13.3 Pa, wherein oxygen is the sole active component.

2. The method of forming a dielectric film according to claim 1, wherein
said Si—$C_nH_{2n+1}$ bond is changed to Si—H bond in said ashing process under said condition in said step (d).

3. The method of forming a dielectric film according to claim 1, wherein said condition is (1).

4. The method of forming a dielectric film according to claim 1, wherein said condition is (2).

5. The method of forming a dielectric film according to claim 1, further comprising the step of:
(e) filling the inside of said recess with a metal film, wherein said step (e) is executed after said step (d).

6. A method forming a dielectric film, comprising the steps of:
(a) forming an insulating film including Si—$C_nH_{2n+1}$ bond;
(b) forming a resist selectively on a main surface of said insulating film;
(c) removing said insulating film not covered with said resist to form a recess in said main surface of said insulating film; and
(d) performing an ashing process using gas plasma to remove said resist;
wherein said step (d) is carried out under a condition that said Si—$C_nH_{2n+1}$ bond is not changed to Si—OH bond.
and wherein said condition is either (1), (2), or (3), wherein
(1) oxygen gas plasma at a temperature of 25° C. or lower and a chamber pressure ranging from 4 to 70 Pa, wherein oxygen is the sole active component,
(2) oxygen gas plasma at a temperature of 100° C. or lower and a chamber pressure ranging from 4 to 13.3 Pa, wherein oxygen is the sole active component, and
(3) ammonia gas plasma, wherein ammonia is the sole active component,
wherein said insulating film is formed on an underlying layer in said step (a), and said recess is so formed as not to reach said underlying layer in said step (c).

7. The method of forming a dielectric film according to claim 1, wherein (a) comprises forming a methyl silsesquioxane film.

8. The method of forming a dielectric film according to claim 1, wherein (a) comprises forming a film by a spin on method or by a CVD method.

9. The method of forming a dielectric film according to claim 1, further comprising, after (a) and prior to (b), forming a second interlayer insulating film on said insulating film including an Si—$C_nH_{2n+1}$ bond.

10. A method of forming a dielectric film, comprising the steps of:
(a) forming an insulating film including Si—$C_nH_{2n+1}$ bond;
(b) forming a resist selectively on a main surface of said insulating film;
(c) removing said insulating film not covered with said resist to form a recess in said main surface of said insulating film; and
(d) performing an ashing process using gas plasma to remove said resist;
wherein said step (d) is carried out under a condition that said Si—$C_nH_{2n+1}$ bond is not changed to Si—OH bond, and wherein said condition is either (1), (2), or (3), wherein
(1) oxygen gas plasma at a temperature of 25° C. or lower and a chamber pressure ranging from 4 to 70 Pa, wherein oxygen is the sole active component,
(2) oxygen gas plasma at a temperature of 100° C. or lower and a chamber pressure ranging from 4 to 13.3 Pa, wherein oxygen is the sole active component, and
(3) ammonia gas plasma, wherein ammonia is the sole active component,
further comprising, after (a) and prior to (b), forming a second interlayer insulating film on said insulating film including an Si—$C_nH_{2n+1}$ bond, and wherein said second interlaying insulating film is selected from the group consisting of silicon nitride film and a silicon carbide film.

11. The method of forming a dielectric film according to claim 1, further comprising prior to (a), forming a silicon oxide underlying layer over a silicon substrate, and wherein said insulating film is formed on the silicon oxide underlying layer.

12. A method of forming a dielectric film, comprising the steps of:
(a) forming an insulating film including Si—$C_nH_{2n+1}$ bond;
(b) forming a resist selectively on a main surface of said insulating film;
(c) removing said insulating film not covered with said resist to form a recess in said main surface of said insulating film; and
(d) performing an ashing process using gas plasma to remove said resist;
wherein said step (d) is carried out under a condition that said Si—$C_nH_{2n+1}$ bond is not changed to Si—OH bond, and wherein said condition is either (1), (2), or (3), wherein
(1) oxygen gas plasma at a temperature of 25° C. or lower and a chamber pressure ranging from 4 to 70 Pa, wherein oxygen is the sole active component,
(2) oxygen gas plasma at a temperature of 100° C. or lower and a chamber pressure ranging from 4 to 13.3 Pa, wherein oxygen is the sole active component, and
(3) ammonia gas plasma, wherein ammonia is the sole active component,
wherein said ashing process is performed under a plasma at an RF power of 300 W, a chamber pressure of 30 Pa, an oxygen flow of 100 sccm and a substrate temperature of 25° C.

13. A method of forming a dielectric film, comprising the steps of:
(a) forming an insulating film including Si—$C_nH_{2n+}$bond;
(b) forming a resist selectively on a main surface of said insulating film;
(c) removing said insulating film not covered with said resist to form a recess in said main surface of said insulating film; and
(d) performing an ashing process using gas plasma to remove said resist;
wherein said step (d) is carried out under a condition that said Si—$C_nH_{2n+1}$ bond is not changed to Si—OH bond, and wherein said condition is either (1), (2), or (3), wherein
(1) oxygen gas plasma at a temperature of 25° C. or lower and a chamber pressure ranging from 4 to 70 Pa, wherein oxygen is the sole active component, (2) oxygen gas plasma at a temperature of 100° C. or lower and a chamber pressure ranging from 4 to 13.3 Pa, wherein oxygen is the sole active component, and (3) ammonia gas plasma, wherein ammonia is the sole active component, further comprising, after (d), forming a TaN film by sputtering.

14. A method of forming a dielectric film, comprising the steps of:

(a) forming an insulating film including Si—$C_nH_{2n+1}$ bond;

(b) forming a resist selectively on a main surface of said insulating film;

(c) removing said insulating film not covered with said resist to form a recess in said main surface of said insulating film; and (d) performing an ashing process using gas plasma to remove said resist;

wherein said step (d) is carried out under a condition that said Si—$C_nH_{2n+}$bond is not changed to Si—OH bond, and wherein said condition is either (1), (2), or (3), wherein (1) oxygen gas plasma at a temperature of 25° C. or lower and a chamber pressure ranging from 4 to 70 Pa, wherein oxygen is the sole active component, (2) oxygen gas plasma at a temperature of 100° C. or lower and a chamber pressure ranging from 4 to 13.3 Pa, wherein oxygen is the sole active component, and (3) ammonia gas plasma, wherein ammonia is the sole active component, further comprising, after (d), forming a TaN film by sputtering and then forming a copper film over said TaN film and having a thickness to fill said recess by sputtering or plating.

15. A method of forming a dielectric film, comprising the steps of:

(a) forming an insulating film including Si—$C_nH_{2n+1}$ bond;

(b) forming a resist selectively on a main surface of said insulating film;

(c) removing said insulating film not covered with said resist to form a recess in said main surface of said insulating film; and (d) performing an ashing process using gas plasma to remove said resist;

wherein said step (d) is carried out under a condition that said Si—$C_nH_{2n+}$bond is not changed to Si—OH bond, and wherein said condition is either (1), (2), or (3), wherein (1) oxygen gas plasma at a temperature of 25° C. or lower and a chamber pressure ranging from 4 to 70 Pa, wherein oxygen is the sole active component, (2) oxygen gas plasma at a temperature of 100° C. or lower and a chamber pressure ranging from 4 to 13.3 Pa, wherein oxygen is the sole active component, and (3) ammonia gas plasma, wherein ammonia is the sole active component, further comprising polishing by CMP.

16. The method of forming a dielectric film according to claim 1, wherein the Si—$C_nH_{2n+1}$ bond is an Si—$CH_3$ bond.

* * * * *